United States Patent [19]

Ledermann et al.

[11] Patent Number: 5,042,708
[45] Date of Patent: Aug. 27, 1991

[54] SOLDER PLACEMENT NOZZLE ASSEMBLY

[75] Inventors: Peter G. Ledermann, Ossining, N.Y.; Arthur L. Leerssen, Austin, Tex.; Alvin D. Nguyen; Raymond E. Prime, both of Austin, Tex.

[73] Assignee: International Business Machines Corporation, Armonk, N.Y.

[21] Appl. No.: 586,655

[22] Filed: Sep. 24, 1990

[51] Int. Cl.⁵ .............................................. B23K 3/02
[52] U.S. Cl. ...................................... 228/55; 228/53; 228/41; 228/33; 228/257; 219/209; 222/592
[58] Field of Search ................. 228/33, 41, 42, 51, 228/52, 55, 219, 220, 254, 256, 257, 214, 19, 20, 53; 118/415, 308; 427/123, 432; 222/591, 592, 594

[56] References Cited

U.S. PATENT DOCUMENTS

| | | | |
|---|---|---|---|
| 1,760,519 | 5/1930 | Palmer | 228/55 |
| 1,906,225 | 5/1933 | Dupau | 228/53 |
| 2,780,712 | 2/1957 | Thomas | 228/53 |
| 3,358,897 | 12/1967 | Christensen | 228/41 |
| 4,903,884 | 2/1990 | Royston et al. | 228/55 |
| 4,932,581 | 6/1990 | Ohle et al. | 228/41 |

FOREIGN PATENT DOCUMENTS 3612341  10/1987  Fed. Rep. of Germany ........ 228/52

Primary Examiner—Richard K. Seidel
Assistant Examiner—Jeanne M. Elpel
Attorney, Agent, or Firm—Charles D. Gunter, Jr.

[57] ABSTRACT

A nozzle assembly is shown for depositing solder onto a series of conductive surfaces such as the mounting pads of a surface mount integrated circuit board. The nozzle assembly includes an upper nozzle mount and a removeable nozzle head which has an interior bore for receiving a portion of the nozzle mount and an elongate heat source. The nozzle head also includes an orifice for receiving solid solder fed within the interior bore to contact the elongate heat source. The interior bore terminates in a solder reservoir for molten solder which is fed within the interior bore to contact the elongate heat source. The molten solder is dispensed through a tip opening to deposit uniform amounts of solder on each pad.

15 Claims, 3 Drawing Sheets

SOLDER PLACEMENT NOZZLE ASSEMBLY

BACKGROUND OF THE INVENTION

1. Field of the Invention

The present invention relates to a system of soldering and particularly to an improved nozzle assembly used to deposit solder in a precise manner, as where solder is deposited onto solder wettable contact pads utilized in the semiconductor industry.

2. Description of the Prior Art

Solder distribution onto mounting pads for surface mount boards of the type used in the semiconductor industry has generally been accomplished in the prior art through the use of screening processes. In these techniques, art work and screens are fabricated having the solder deposition pattern. Then, a precision alignment process is carried out wherein the solder is screened onto the surface mount pads. The solder paste used for this process requires a substantial cure time and a substantial bake time. Various problems result due to the complexity of the alignment process making the prior art technique relatively time consuming.

The prior art technique utilizing screening is further complicated by a requirement that the pattern mixes very fine lead pitch and width surface mount pads along with standard surface mount parts. For example, in the case of tape automated bonding, the pitches vary from about 4 to 20 mils while, the standard surface mount parts have pitches in the range from about 20 to 50 mils. Due to the precision nature of the operation, it is common to utilize separate screening steps, one for the very fine lead pitch and width surface mount parts and second for the standard surface mount parts. There is the possibility of damaging the solder deposited in a previous step when multiple screening operations are carried out. Additionally, screening fine line solder represents a problem because the solder paste tends to stick in the openings of the screen as the openings get progressively narrower.

The prior art screening systems also present problems due to the difficulty of performing rework operations. Once a defective part has been removed, there is no commonly available technique for replacing the solder on the board site. While techniques exist to remove the solder after the part has been removed, replenishing the isolated site by screening is not generally feasible.

The present invention has as its object to provide a device which is usable either manually or under robotic control to deposit solder onto fine line pitch and width surfaces in precise fashion.

Another object of the invention is to deposit solder onto solder wettable contact pads with substantially uniform amounts on each pad.

Another object of the invention is to provide a device for depositing solder on pads of surface mount board without the requirement for artwork or solder screens.

Another object of the invention is to define a system employing a device which will apply solder in a fine line pattern to a circuit card.

Another object of the invention is to provide a two-piece nozzle with a lower section which is easily removeable for cleaning and maintenance.

Another object of the invention is to provide a solder placement nozzle in which the soldering iron operating temperature is lowered by properly insulating the soldering iron within the surrounding nozzle housing.

Another object of the invention is to provide a solder placement nozzle having a removeable wettable ring portion to facilitate periodic cleaning and maintenance.

Another object of the invention is to provide a solder placement nozzle which merges the application of flux and an inert cover gas at the solder application site through the use of extension tubes which merge and incorporate these functions.

SUMMARY OF THE INVENTION

The nozzle assembly of the invention is used to deposit solder onto fine line pitch and width surfaces and is particularly adapted for use in depositing solder onto a series of conductive surfaces such as the solder wettable contact pads of a surface mount circuit board. The assembly includes a nozzle mount supportable above the conductive surface to be soldered, the nozzle mount having a length and having an internal bore sized to receive an elongate heat source. The assembly also includes a nozzle head having a solder feed orifice and having an interior bore sized to receive a portion of the length of the nozzle mount, thereby allowing the elongate heat source to extend at least partly within the interior bore of the nozzle head for contacting solid solder fed within the interior bore through the solder feed orifice. Mounting means are provided for removably mounting the nozzle head onto the nozzle mount. The interior bore of the nozzle head terminates in a solder reservoir for molten solder which is fed within the interior bore to contact the elongate heat source.

Preferably the nozzle mount and nozzle head are formed of a non-wettable, plastic material. The elongate heat source is preferably the heated metal tip of a soldering iron. An insulating sleeve, received within the internal bore of the nozzle mount, separates the heated metal tip of the soldering iron from the nozzle mount. The insulating sleeve is preferably formed from a high temperature machinable ceramic having low thermal conductivity and high temperature resistance.

The interior bore of the nozzle head terminates in a tip opening for depositing solder onto the conductive surface. A replaceable insert assembly is preferably received within the tip opening of the nozzle head. The insert assembly has a wettable wall region for contacting the molten solder passing from the solder reservoir out the tip opening. The preferred insert assembly includes an outer ring of non-wettable material and an inner ring of wettable material which is sized to be press-fit within the outer ring. The preferred nozzle tip opening is generally cylindrical in shape and is sized to receive the insert assembly in press-fit fashion.

The nozzle head is also preferably provided with at least one extension tube mounted thereon adjacent the nozzle tip. The extension tube is arranged to communicate with an internal passageway provided within the nozzle head. The internal passageway is connectable to a source of soldering flux, whereby flux can be supplied through the extension tube opening to the solder site adjacent the tip opening. One or more additional internal passageways can be connected to a source of inert cover gas for merging the application of flux and an inert cover gas at the solder application site.

Additional objects, features and advantages will be apparent in the written description which follows.

DETAILED DESCRIPTION OF THE INVENTION

Figure 1:
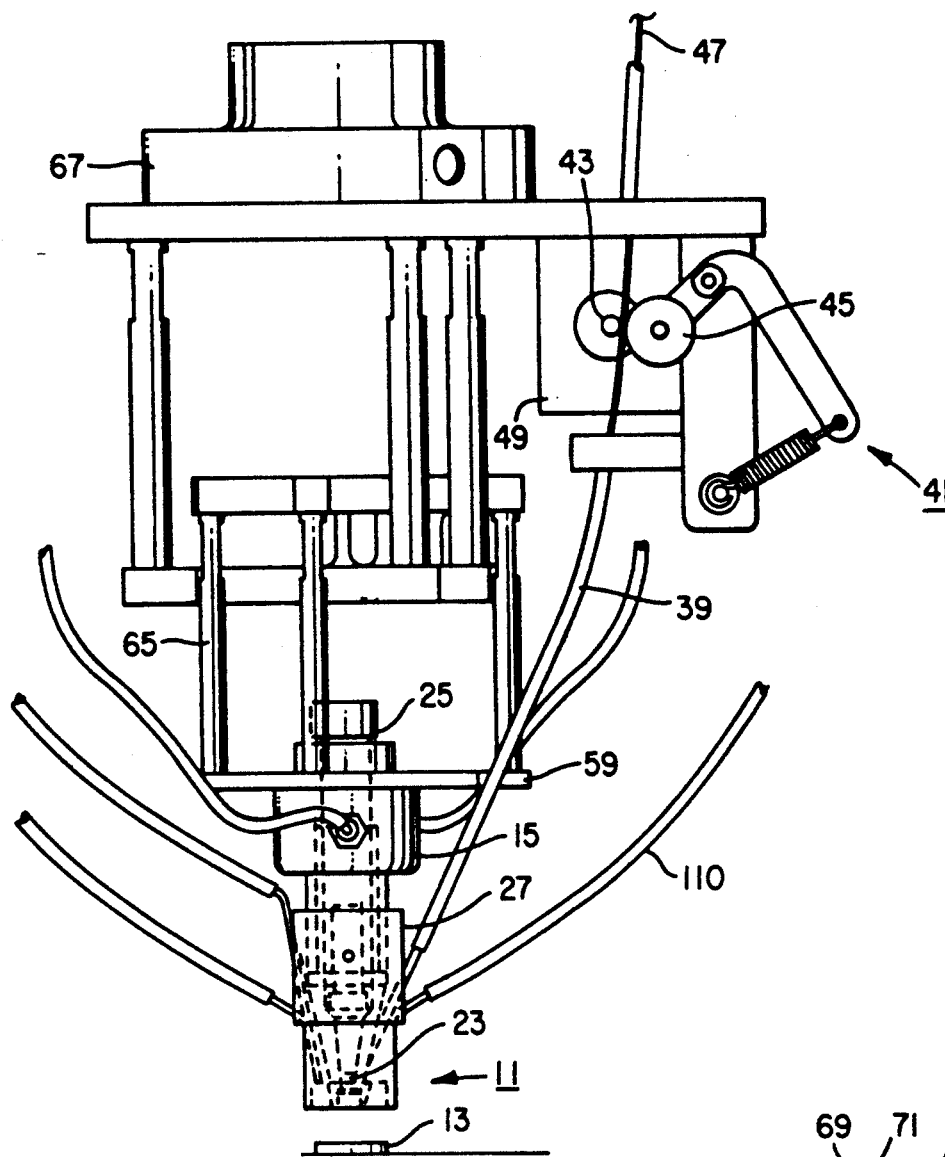
FIG. 1 is a schematic, side view of the nozzle assembly of the invention positioned over a conductive surface, to be soldered.
Figure 2:
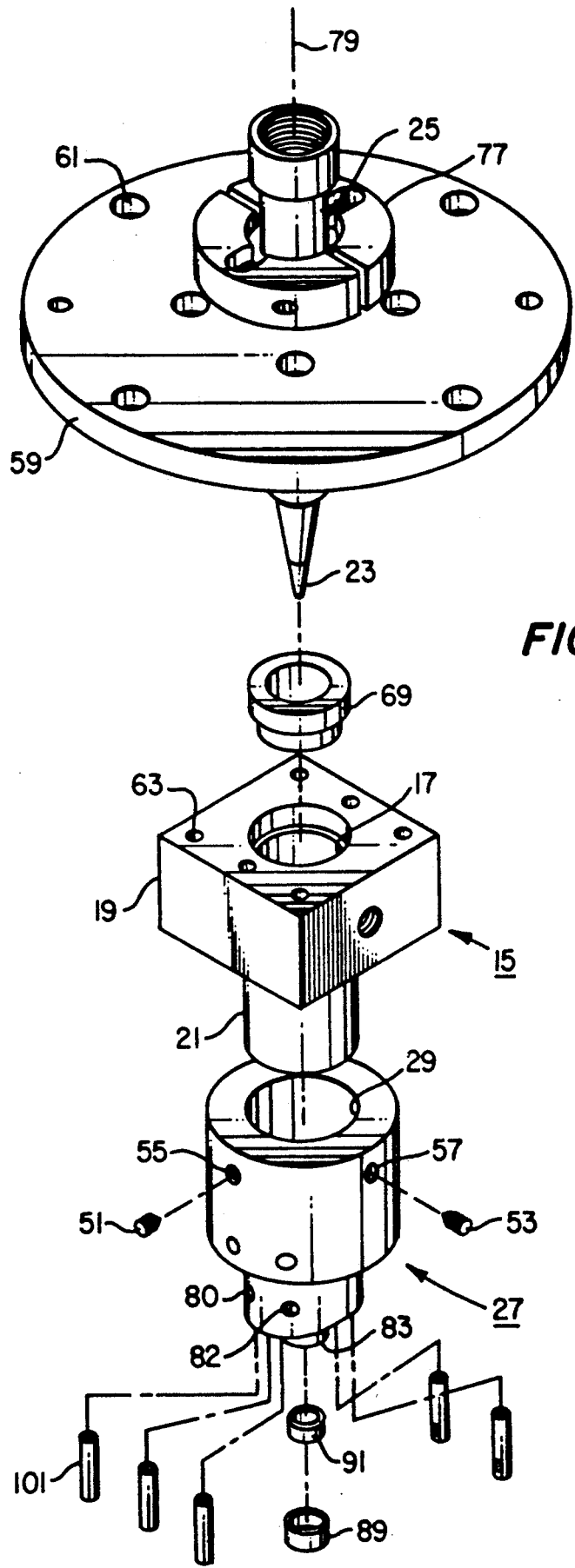
FIG. 2 is an overall view of the nozzle assembly showing the components thereof in exploded fashion.

FIG. 1 shows a nozzle assembly of the invention designated generally as 11. The assembly 11 is used to deposit solder onto a selected site which is preferably a conductive surface 13. Preferably, the conductive surface 13 is the solder wettable contact pad of a surface mount integrated circuit board. The nozzle assembly 11 includes a nozzle mount (15 in FIGS. 1 and 3) which is supportable above the conductive surface 13 to be soldered. The nozzle mount 15 has a length ("1" in FIG. 3) and has an internal bore 17 sized to receive an elongate heat source. Preferably, the nozzle mount 15 has a polygonally shaped upper exterior 19, approximately square, and a generally cylindrically shaped lower exterior 21 which together define the overall length ("1"). As shown in FIG. 2, the elongate heat source is preferably the heated metal tip 23 of a conventional soldering iron 25. The soldering iron 25 is commercially available and can be, for instance, a nickel, iron or palladium coated copper soldering iron connected to a conventional electrical heating source (not shown).

The nozzle assembly 11 also includes a nozzle head 27 which has an upper, generally cylindrical interior bore (29 in FIG. 4) which joins a lower, converging interior bore 31 provided with a solder feed orifice 33 connected by a slanting internal passageway 35 which passes through the body 37 of the nozzle head 27 to a source of solid solder being fed to the passageway. As shown in FIG. 1, the internal passageway 35 can be connected by a tube 39 to a solder wire feed assembly 41. The feed assembly 41 can include, e.g., a motor driven gear wheel 43 and a pressure wheel 45 which are used to deliver a known length of wire solder 47 to the orifice 33. Advancement of the wire solder 47 can be precisely controlled through the use of a stepper motor 49, as will be appreciated by those skilled in the art. Solder fed through the orifice 33 melts on the heated metal tip 23 of the soldering iron and flows to the bottom of a reservoir (81 in FIG. 4) formed by the converging interior bore 31 of the nozzle head 27 to form a small solder volume.

Figure 3:
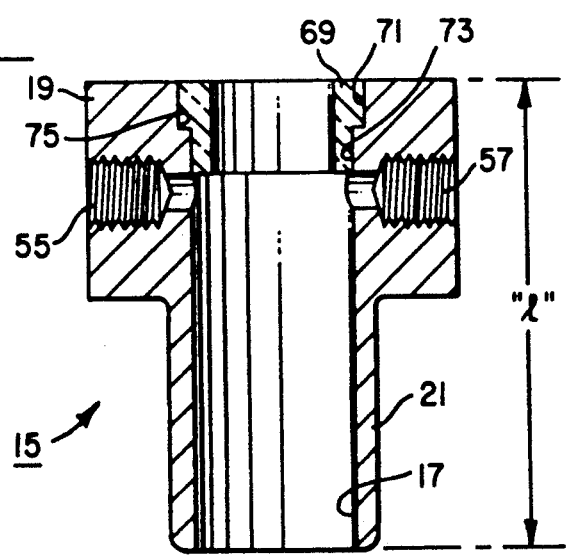
FIG. 3 is a side, cross-sectional view of the nozzle mount of the assembly.

Mounting means are provided for removably mounting the nozzle head 27 to the nozzle mount 15. As shown in FIGS. 2 and 3, the mounting means can conveniently comprise a threaded member, such as set screws 51, 53 which are received within mating threaded bores 55, 57 provided in the nozzle head 27. The set screws are engageable with the nozzle mount lower exterior 21 to removably secure the nozzle head 27 to the nozzle mount 15.

The nozzle mount 15 can be supported in any convenient fashion over the conductive surface 13 to be soldered. In the embodiment of FIG. 1, the nozzle mount 15 is secured to a circular attachment plate 59 by means of mating bores 61, 63 (FIG. 2) which are adapted to receive engagement means such as screw connectors. The attachment plate 59 is, in turn, supported by means of a yoke assembly 65 (FIG. 1) from a robot assembly 67. It will be understood, however, that the nozzle assembly 11 could be supported in a variety of fashions, depending upon the particular soldering application.

Preferably, the nozzle mount 15 and nozzle head 27 are formed from a non-wettable, plastic material. A preferred material is the polyimide sold under the trade name VESPEL by E.I. duPont deNemours & Company. This material is lightweight, easily machinable and, to some extent chemically resistant. However, the material is degraded rapidly at high temperatures for long periods of time. At operating temperatures above 500°-600° F., dimensions, thermal conductivity and other critical properties of the VESPEL material change.

In order to maintain proper operating temperatures for the soldering iron 25 and to protect the surrounding nozzle mount 15, an insulating sleeve (69 in FIG. 3) is preferably received within the internal bore 17 of the nozzle mount 15 to separate the heated metal tip 23 of the soldering iron 25 from the plastic components of the nozzle assembly. As shown in FIG. 3, the internal bore 17 of the nozzle mount 15 is defined by generally cylindrical sidewalls, the internal diameter of the sidewalls decreasing from an upper extent 71 to a lower extent 73 to form an internal shoulder 75. The insulating sleeve 69 has a stepped external diameter sized to be received upon the internal shoulder 75 in the nozzle mount interior bore 17. The insulating sleeve 69 is preferably formed from a high temperature machinable ceramic material having low thermal conductivity and high temperature resistance. A suitable material is commercially available under the trade name MACOR.

As shown in FIGS. 1 and 2, the attachment plate 59 supports the nozzle mount 19 and includes a mounting collar 77 for mounting and orienting the soldering iron 25 along a vertical axis 79 coincident with the internal bore 17 of the nozzle mount and the interior bore 29 of the nozzle head 27. One ore more soldering iron centering screws are received in threaded bores 80, 82 for properly aligning the heated metal tip 23. The assembled nozzle head and nozzle mount support the heated metal tip 23 of the soldering iron 25 with the heated metal tip 23 contacting the insulating sleeve 69 rather than the plastic material of the nozzle mount.

Figures 4, 5:
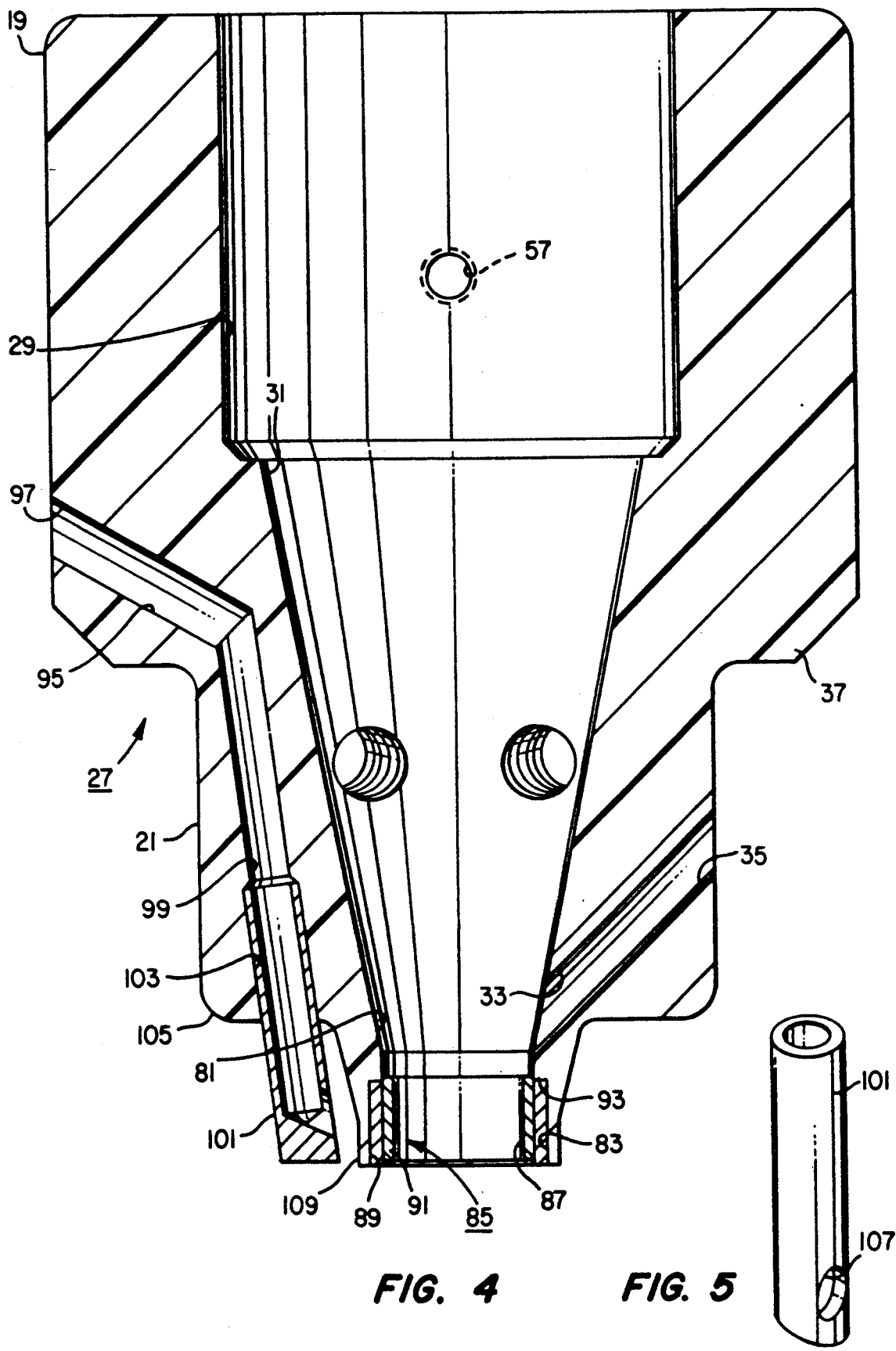
FIG. 4 is a side, cross-sectional view of the nozzle head of the assembly of the invention.
FIG. 5 is an isolated view of the extension tube used with the nozzle head of FIG. 4.

As shown in FIG. 4, the converging interior bore 31 of the nozzle head 27 terminates in a solder reservoir (generally illustrated at 81) for molten solder which is fed within the lower, converging interior bore 31 from the orifice 33 to contact the heated metal tip 23 of the soldering iron. The converging interior bore 31 terminates in a tip opening 83 for depositing solder from the solder reservoir 81 onto the soldering site.

A replaceable insert assembly 85 is received within the tip opening 83 of the nozzle head 27. The insert assembly 85 includes a generally cylindrical, wettable wall region 87 for contacting the molten solder passing from the solder reservoir 81 out the tip opening 83. Preferably, the insert assembly 85 includes an outer ring 89 of non-wettable material and an inner ring 91 of wettable material which is sized to be press-fit within the outer ring 89. The nozzle tip opening 83 is generally cylindrically shaped and is sized to receive the insert assembly in press-fit fashion. As best seen in FIG. 4, the tip opening 83 decreases in internal diameter to form a stop or shoulder region 93 to facilitate positioning of the replaceable insert assembly 85. The wettable ring 91 can be formed from, e.g., nickel, while the outer ring 89 can be of a plastic similar or identical to the plastic of the nozzle head 27.

As also shown in FIG. 4, the body 37 of the nozzle head 27 can also be provided with one or more internal passageways 95. These passageways are located within the wall section of the body 37 between the interior bore 31 and the exterior of the nozzle head 27. Passageway 95 includes an inlet opening 97 provided in the upper section 19 of the nozzle head 27 which communicates by means of angled passageway 95 with an outlet opening 99 in the lower portion 21 of the nozzle head. Preferably, a generally cylindrical extension tube 101 is received within a counter bored opening 103 which connects the tip region 105 of the nozzle head 27 with the outlet opening 99 of the internal passageway 95. The extension tube 101 includes a circular, side opening 107 in the region of the nozzle tip 109. It will be understood that depending upon the application, the extension tube 101 can be a straight cylindrical tube having an open end adjacent the nozzle tip 109.

The internal passageway 95 can be connected to a source of soldering flux by means of a heated supply tube (110 in FIG. 1), whereby flux supplied through the extension tube opening 107 can be applied to a solder site adjacent the tip opening 83. Preferably, a plurality of passageways and extension tubes 101 (FIG. 2) are spaced about the circumference of the tip opening 83. Selected passageways can be connected to a source of inert cover gas, such as nitrogen gas, to thereby merge the application of flux and cover gas to the solder application site.

In operation, the nozzle assembly 11 is used to deposit solder onto solder wettable contact pads 13, with solder being deposited in substantially uniform amounts on each pad. The reservoir 81 of the nozzle head comprises a plenum for the solder fed through the orifice 33 and melted by the heated tip 23 of the soldering iron 25. After a sufficient amount of solder is fed, a small ball of molten solder becomes extended below the nozzle tip. The nozzle tip 109 is supported over the soldering site and maintained at a sufficient, predetermined distance above the substrate so that contact between the pad and nozzle tip does not occur. The wettable ring 91 and soldering tip 23 provide a predetermined surface tension which causes a discrete amount of solder to be deposited upon the soldering site as the assembly 11 is moved over the substrate.

An invention has been provided with several advantages The nozzle assembly of the invention merges flux and an inert cover gas in the vicinity of the nozzle tip. The assembly includes two sections with the lower section being quickly removeable for cleaning and maintenance. A wettable ring which is used to provide the appropriate surface tension in the nozzle tip is provided as a replaceable insert assembly to further facilitate maintenance and replacement and to allow easy removal of flux residue buildup. An insulating sleeve provided in the nozzle mount, helps to maintain proper soldering iron temperature so that the heating capacity and desired operating range of the soldering iron are maintained. The insulating sleeve reduces heat transfer to the plastic material of the nozzle assembly and maintains a higher, more stable operating temperature for the soldering iron. The insulating sleeve also prevents material breakdown, deterioration and cracking of the plastic material and prolongs the life of the nozzle assembly. One or more internal passageways and extension tubes permit flux and cover gas to be provided at a focal point adjacent the nozzle tip where solder is being applied. The extension tubes can be used to apply flux to the soldering site before and after the soldering process.

While the invention has been shown in only one of its forms, it is not thus limited but is susceptible to various changes and modifications without departing from the spirit thereof.

I claim:

1. A nozzle assembly of the type which includes a heated metal tip of a soldering iron for depositing solder onto a series of solder wettable contact pads of a surface mount circuit board, the nozzle assembly comprising:

a nozzle mount supportable above the conductive surface to be soldered, the nozzle amount having a polygonally shaped upper exterior and a generally cylindrically shaped lower exterior which together define an overall length, the nozzle mount also having an internal bore sized to receive the heated metal tip of the soldering iron;

a nozzle head having an upper, generally cylindrical interior bore which joins a lower, converging interior bore, provided with a solder feed orifice, the upper, generally cylindrical interior bore being selectively sized to receive the lower exterior of the nozzle mount, thereby allowing the heated metal tip of the soldering iron to extend at least partly within the lower converging interior bore of the nozzle head for contacting solid solder fed within the lower, converging interior bore through the solder feed orifice;

mounting means for removably mounting the nozzle head onto the nozzle mount; and wherein the lower, converging interior bore of the nozzle head terminates in a solder reservoir for molten solder which is fed within the lower, converging interior bore to contact the heated metal tip of the soldering iron.

2. A nozzle assembly of the type which includes a heated metal tip of a soldering iron for depositing solder onto a series of solder wettable contact pads of a surface mount circuit board, the nozzle assembly comprising:

a nozzle mount supportable above the conductive surface to be soldered, the nozzle amount having a polygonally shaped upper exterior and a generally cylindrically shaped lower exterior which together define an overall length, the nozzle mount also having an internal bore sized to receive the heated metal tip of the soldering iron;

a nozzle head having an upper, generally cylindrical interior bore which joins a lower, converging interior bore, provided with a solder feed orifice, the upper, generally cylindrical interior bore being selectively sized to receive the lower exterior of the nozzle mount, thereby allowing the heated metal tip of the soldering iron to extend at least partly within the lower converging interior bore of the nozzle head for contacting solid solder fed within the lower, converging interior bore through the solder feed orifice;

mounting means for removably mounting the nozzle head onto the nozzle mount;

wherein the lower, converging interior bore of the nozzle head terminates in a solder reservoir for molten solder which is fed within the lower, converging interior bore to contact the heated metal tip of the soldering iron and wherein the nozzle mount and nozzle head are formed of a non-wettable, plastic material.

3. The nozzle assembly of claim 2, wherein a solder supply tube is attached to the solder feed orifice of the nozzle head, the solder supply tube being adapted to receive a continuous length of solid solder wire fed by a stepper motor into the supply tube.

4. The nozzle assembly of claim 3, wherein the mounting means is at least one set screw received within a set screw opening provided in the nozzle head.

5. The nozzle assembly of claim 4, further comprising;

an attachment plate for supporting the nozzle mount above the contact pads to be soldered, the attachment plate including a mounting collar for mounting and orienting the soldering iron along a vertical axis coincident with the internal bore of the nozzle mount and the interior bore of the nozzle head.

6. A nozzle assembly of the type which includes a heated metal tip of a soldering iron for depositing solder, the nozzle assembly comprising:

a nozzle mount having a polygonally shaped upper exterior and a generally cylindrically shaped lower exterior which together define an overall length, the nozzle mount also having a stepped internal bore sized to receive the heated metal tip of the soldering iron;

a nozzle head having an upper, generally cylindrical interior bore which joins a lower, converging interior bore, provided with a solder feed orifice, the upper, generally cylindrical interior bore being selectively sized to receive the lower exterior of the nozzle mount, thereby allowing the heated metal tip of the soldering iron to extend at least partly within the lower converging interior bore of the nozzle head for contacting solid solder fed within the lower, converging interior bore of the nozzle head terminates in a solder reservoir for molten solder which is fed within the lower, converging interior bore to contact the heated metal tip of the soldering iron;

mounting means for removably mounting the nozzle head onto the nozzle mount; and an insulating sleeve received within the stepped internal bore of the nozzle mount which separates the heated metal tip of the soldering iron from the nozzle mount.

7. A nozzle assembly of the type which includes a heated metal tip of a soldering iron for depositing solder, the nozzle assembly comprising:

a nozzle mount having a polygonally shaped upper exterior and a generally cylindrically shaped lower exterior which together define an overall length, the nozzle mount also having a stepped internal bore sized to receive the heated metal tip of the soldering iron;

a nozzle head having an upper, generally cylindrical interior bore which joins a lower, converging interior bore, provided with a solder feed orifice, the upper, generally cylindrical interior bore being selectively sized to receive the lower exterior of the nozzle mount, thereby allowing the heated metal tip of the soldering iron to extend at least partly within the lower, converging interior bore of the nozzle head for contacting solid solder fed within the lower, converging interior bore through the solder feed orifice, and wherein the lower, converging interior bore of the nozzle head terminates in a solder reservoir for molten solder which is fed within the lower, converging interior bore to contact the heated metal tip of the soldering iron;

mounting means for removably mounting the nozzle head onto the nozzle mount;

an insulating sleeve received within the stepped internal bore of the nozzle mount which separates the heated metal tip of the soldering iron from the nozzle amount; and wherein the nozzle mount and nozzle head are formed of a non-wettable, plastic material.

8. The nozzle assembly of claim 7, wherein the internal bore of the nozzle mount is defined by generally cylindrical sidewalls and wherein the internal diameter of the sidewalls decreases from the upper extent to the lower extent thereof to form an internal shoulder.

9. The nozzle assembly of claim 8, wherein the insulating sleeve has a stepped external diameter sized to be received upon the internal shoulder in the nozzle mount internal bore.

10. The nozzle assembly of claim 9, wherein the insulating sleeve is formed from a high temperature machinable ceramic having low thermal conductivity and high temperature resistance.

11. A nozzle assembly of the type which includes a heated metal tip of a soldering iron for depositing solder, the nozzle assembly comprising:

a nozzle mount having a polygonally shaped upper exterior and a generally cylindrically shaped lower exterior which together define an overall length, the nozzle mount also having a stepped internal bore sized to receive the heated metal tip of the soldering iron;

a nozzle head having an upper, generally cylindrical interior bore which joins a lower, converging interior bore, provided with a solder feed orifice, the upper, generally cylindrical interior bore being selectively sized to receive the lower exterior of the nozzle mount, thereby allowing the heated metal tip of the soldering iron to extend at least partly within the lower, converging interior bore of the nozzle head for contacting solid solder fed within the lower, converging interior bore through the solder feed orifice, and wherein the lower, converging interior bore of the nozzle head terminates in a solder reservoir for molten solder which is fed within the lower, converging interior bore to contact the heated metal tip of the soldering iron, and wherein the converging interior bore of the nozzle head terminates in a tip opening;

mounting means for removably mounting the nozzle head onto the nozzle mount; and a replaceably insert assembly received within the tip opening of the nozzle head, the insert assembly having a wettable wall region for contacting the molten solder passing from the solder reservoir out the tip opening.

12. A nozzle assembly which includes a heated metal tip of a soldering iron for depositing solder, the nozzle assembly comprising:

a nozzle mount having a polygonally shaped upper exterior and a generally cylindrically shaped lower exterior which together define an overall length, the nozzle mount also having a stepped internal bore sized to receive the heated metal tip of the soldering iron;

a nozzle head having an upper, generally cylindrical interior bore which joins a lower, converging interior bore, provided with a solder feed orifice, the upper, generally cylindrical interior bore being selectively sized to receive the lower exterior of the nozzle mount, thereby allowing the heated metal tip of the soldering iron to extend at least partly within the lower, converging interior bore of the nozzle head for contacting solid solder fed within the lower, converging interior bore through the solder feed orifice, and wherein the lower, converging interior bore of the nozzle head terminates in a solder reservoir for molten solder which is fed within the lower, converging interior bore to contact the heated metal tip of the soldering iron, and wherein the converging interior bore of the nozzle head terminates in a tip opening;

mounting means for removably mounting the nozzle head onto the nozzle mount; and a replaceably insert assembly received within the tip opening of the nozzle head, the insert assembly having a wettable wall region for contacting the molten solder passing from the solder reservoir out the tip opening, and wherein the insert assembly includes an outer ring of non-wettable material and an inner ring of wettable material which is sized to be press-fit within the outer ring.

13. The nozzle assembly of claim 12, wherein the nozzle tip opening is generally cylindrical and is sized to receive the insert assembly in press-fit fashion.

14. A nozzle assembly of the type which includes a heated metal tip of a soldering iron to apply molten solder to a site, comprising:

a nozzle mount having a polygonally shaped upper exterior and a generally cylindrically shaped lower exterior which together define an overall length, the nozzle mount also having a stepped internal bore sized to receive the heated metal tip of the soldering iron;

a nozzle head having an upper, generally cylindrical interior bore which joins a lower, converging interior bore, provided with a solder feed orifice, the upper, generally cylindrical interior bore being selectively sized to receive the lower exterior of the nozzle mount, thereby allowing the heated metal tip of the soldering iron to extend at least partly within the lower, converging interior bore of the nozzle head for contacting solid solder fed within the lower, converging interior bore through the solder feed orifice, and wherein the lower, converging interior bore of the nozzle head terminates in a solder reservoir for molten solder which is fed within the lower, converging interior bore to contact the heated metal tip of the soldering iron and a nozzle tip including a tip opening which dispenses molten solder from the nozzle assembly;

mounting means for removably mounting the nozzle head onto the nozzle mount; and wherein the nozzle head has at least one extension tube mounted thereon adjacent the nozzle tip, the extension tube being arranged to communicate with an internal passageway provided within the nozzle head.

15. A nozzle assembly of the type which includes a heated metal tip of a soldering iron to apply molten solder to a site, comprising:

a nozzle mount having a polygonally shaped upper exterior and a generally cylindrically shaped lower exterior which together define an overall length, the nozzle mount also having a stepped internal bore sized to receive the heated metal tip of the soldering iron;

a nozzle head having an upper, generally cylindrical interior bore which joins a lower, converging interior bore, provided with a solder feed orifice, the upper, generally cylindrical interior bore being selectively sized to receive the lower exterior of the nozzle mount, thereby allowing the heated metal tip of the soldering iron to extend at least partly within the lower, converging interior bore of the nozzle head for contacting solid solder fed within the lower, converging interior bore through the solder feed orifice, and wherein the lower, converging interior bore of the nozzle head terminates in a solder reservoir for molten solder which is fed within the lower, converging interior bore to contact the heated metal tip of the soldering iron and a nozzle tip including a tip opening which dispenses molten solder from the nozzle assembly;

mounting means for removably mounting the nozzle head onto the nozzle mount; and wherein the nozzle head has at least one extension tube mounted thereon adjacent the nozzle tip, the extension tube being arranged to communicate with an internal passageway provided within the nozzle head, and wherein the internal passageway is connected to a source of flux, whereby flux supplied through the extension tube opening can be applied to solder site adjacent the tip opening.

* * * * *